United States Patent
Miyagawa et al.

(10) Patent No.: US 8,524,005 B2
(45) Date of Patent: Sep. 3, 2013

(54) HEAT-TRANSFER STRUCTURE AND SUBSTRATE PROCESSING APPARATUS

(75) Inventors: Masaaki Miyagawa, Nirasaki (JP); Tetsuji Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 665 days.

(21) Appl. No.: 11/774,420

(22) Filed: Jul. 6, 2007

(65) Prior Publication Data

US 2008/0006207 A1    Jan. 10, 2008

Related U.S. Application Data

(60) Provisional application No. 60/832,154, filed on Jul. 21, 2006.

(30) Foreign Application Priority Data

Jul. 7, 2006 (JP) .................................. 2006-188262

(51) Int. Cl.
*C23C 16/44* (2006.01)
*H01L 21/3065* (2006.01)

(52) U.S. Cl.
USPC .......................................... 118/724; 156/915

(58) Field of Classification Search
USPC .................. 118/723 E, 723 R, 724, 725, 728; 156/345.43, 345.44, 345.45, 345.46, 345.47, 156/345.51, 345.52, 345.53, 915; 361/234
See application file for complete search history.

(56) References Cited

U.S. PATENT DOCUMENTS

| | | | |
|---|---|---|---|
| 6,503,368 B1 * | 1/2003 | Kholodenko et al. ... | 156/345.51 |
| 6,693,790 B2 * | 2/2004 | Matsuki et al. ............... | 361/234 |
| 6,723,202 B2 * | 4/2004 | Nagaiwa et al. ......... | 156/345.43 |
| 6,897,411 B2 * | 5/2005 | Beer et al. ..................... | 219/390 |
| 2004/0154545 A1 * | 8/2004 | Takeda et al. ................. | 118/728 |
| 2006/0016554 A1 * | 1/2006 | Ahn ............................ | 156/272.2 |
| 2006/0193101 A1 * | 8/2006 | Sogabe et al. ................ | 361/234 |
| 2007/0169891 A1 * | 7/2007 | Koshiishi et al. ........ | 156/345.47 |
| 2008/0166894 A1 * | 7/2008 | Miyagawa et al. ........... | 438/798 |
| 2008/0210379 A1 * | 9/2008 | Miyagawa et al. ...... | 156/345.51 |
| 2008/0239691 A1 * | 10/2008 | Miyagawa et al. ........... | 361/809 |

FOREIGN PATENT DOCUMENTS

| | | | |
|---|---|---|---|
| JP | 02255593 A | * | 10/1990 |
| JP | 2002-16126 | | 1/2002 |
| JP | 2006-165136 | | 6/2006 |

OTHER PUBLICATIONS

Japanese Office Action issued Feb. 25, 2011, in Patent Application No. 2006-188262 (with English-language translation).

* cited by examiner

*Primary Examiner* — Sylvia R MacArthur
*Assistant Examiner* — Michelle Crowell
(74) *Attorney, Agent, or Firm* — Oblon, Spivak, McClelland, Maier & Neustadt, L.L.P.

(57) ABSTRACT

A heat-transfer structure which can keep a consumable component at a temperature of 225° C. or less during etching of a substrate. The heat-transfer structure is disposed in a chamber where plasma processing is performed on a wafer as the substrate under a reduced pressure. The heat-transfer structure is comprised of a focus ring having an exposed surface exposed to plasma, a susceptor and an electrostatic chuck that cool the consumable component, and a heat-transfer sheet interposed between the focus ring and the electrostatic chuck and made of a gel-like material. The ratio of hardness of the heat-transfer sheet expressed in Asker C to thermal conductivity of the heat-transfer sheet expressed in W/m·K is less than 20.

10 Claims, 5 Drawing Sheets

HEAT-TRANSFER STRUCTURE AND SUBSTRATE PROCESSING APPARATUS

BACKGROUND OF THE INVENTION

1. Field of the Invention

The present invention relates to a heat-transfer structure and a substrate processing apparatus, and more particularly to a heat-transfer structure disposed in an evacuated chamber of a substrate processing apparatus.

2. Description of the Related Art

In general, etching apparatuses have been known as substrate processing apparatuses which process substrates using plasma. The substrate processing apparatuses are provided with an evacuated chamber in which plasma is generated. In the chamber, a mounting stage on which a wafer employed as a substrate is to be mounted is disposed. The mounting stage is provided with a disk-shaped electrostatic chuck (ESC) disposed on top of the mounting stage, and a focus ring made of, for example, silicon disposed around the outer peripheral edge of the upper surface of the electrostatic chuck.

In performing etching on a wafer, the wafer is mounted on the electrostatic chuck, pressure in the chamber is then reduced, process gas, for example, mixed gas comprised of $C_4F_8$ gas, $O_2$ gas, and Ar gas is introduced into the chamber, and radio-frequency electric current is supplied into the chamber to generate plasma from the mixed gas. The plasma is caused to converge on the wafer by the focus ring to perform etching on the wafer. As a result of etching, the temperature of the wafer increases, but the wafer is cooled by a cooling mechanism incorporated in the electrostatic chuck. During cooling, helium (He) gas with high heat transference is caused to flow toward the back side of the wafer from the upper surface of the electrostatic chuck so as to improve heat transference between the electrostatic chuck and the wafer, whereby the wafer can be cooled with efficiency.

On the other hand, since a boundary between the back side of the focus ring and the outer peripheral edge of the electrostatic chuck is the boundary at which solid objects are in contact with each other, the degree of adhesion between the focus ring and the electrostatic chuck is small, and hence minute gaps are formed in the boundary. In particular, since the interior of the chamber is evacuated during etching, these minute gaps form a vacuum heat insulating layer, causing deterioration of heat transference between the electrostatic chuck and the focus ring and making it impossible to cool the focus ring with efficiency like the wafer. As a result, the temperature of the focus ring becomes higher than that of the wafer.

If the temperature of the focus ring is high, the outer peripheral edge of the wafer is higher in temperature as compared with the inside of the outer peripheral edge of the wafer, and hence the over-surface etching uniformity of the wafer deteriorates.

Also, reaction products are produced during etching and adhere as polymer films to side walls of the chamber and the focus ring. The polymer films protect the focus ring and others from plasma and prevent wear of the focus ring and others, but as shown in a graph of FIG. 5, the film thickness of polymer decreases as the temperature of an object (such as the focus ring) to which polymer adheres increases. Thus, as described above, when the temperature of the focus ring is high, polymer as reaction products is less likely to adhere to the focus ring, and hence the focus ring is directly exposed to plasma, causing the focus ring to wear out quickly.

Further, since the focus ring cannot be cooled with efficiency due to the formed vacuum heat insulating layer, heat accumulates over time, and thus the focus ring cannot be kept at a constant temperature during etching of wafers in the same lot. For this reason, processing performance deteriorates, and for example, distribution of etch rate varies from wafer to wafer.

To cope with this, the applicant of the present invention has proposed a method of increasing the degree of adhesion between the focus ring and the electrostatic chuck so as to improve heat transference between the electrostatic chuck and the focus ring as a counter measure. Specifically, a heat-transfer medium made of a heat-resistant elastic member such as conductive silicon rubber is interposed between the focus ring and the electrostatic chuck (see e.g. Japanese Laid-Open Patent Publication (Kokai) No. 2002-016126).

According to this method, the heat-transfer medium becomes deformed between the focus ring and the electrostatic chuck. This improves the degree of adhesion between the electrostatic chuck and the focus ring, causing improvement of heat transference between the electrostatic chuck and the focus ring.

In recent years, however, the required level of over-surface etching uniformity of wafers has been increasing, and also, the demand for long-life focus rings have been growing. As a result, the focus ring has been required to be kept at a temperature 225° C. or less during etching. On the other hand, since the conductive silicon rubber which is a heat-transfer member has low fluidity, it cannot fully fill minute gaps in the boundary between the focus ring and the electrostatic chuck, and as a result, even if the heat-transfer member is interposed between the electrostatic chuck and the focus ring, there is a limit to improvement of heat transference between the electrostatic chuck and the focus ring, and it is difficult to keep the focus ring at a temperature of 225° C. or less during etching.

SUMMARY OF THE INVENTION

The present invention provides a heat-transfer structure and a substrate processing apparatus which can keep a consumable component at a temperature of 225° C. or less during etching of a substrate.

Accordingly, the first aspect of the present invention provides a heat-transfer structure disposed in a processing chamber in which plasma processing is performed on a substrate under a reduced pressure, comprising a consumable component comprising an exposed surface exposed to plasma, a cooling component that cools the consumable component, and a heat-transfer member interposed between the consumable component and the cooling component and made of a gel-like material, wherein a ratio of hardness of the heat-transfer member expressed in Asker C to thermal conductivity of the heat-transfer member expressed in W/m·K is less than 20.

With the arrangement of the first aspect of the present invention, the heat-transfer member made of a gel-like material is interposed between the consumable component comprising the exposed surface exposed to plasma and the cooling component that cools the consumable component, and the ratio of hardness of the heat-transfer member expressed in Asker C to thermal conductivity of the heat-transfer member expressed in W/m·K is less than 20. Since the gel-like material fills minute gaps in a boundary between the consumable component and the cooling component, and the ratio of hardness of the heat-transfer member expressed in Asker C to thermal conductivity of the heat-transfer member expressed in W/m·K is less than 20, heat transference between the consumable component and the cooling component can be improved as compared with the conventional art. As a result, the consumable component can be kept at a temperature of 225° C. or less during etching of the substrate.

The present invention can provide a heat-transfer structure, wherein the consumable component comprises an annular member disposed in such a manner as to enclose an outer peripheral edge of the substrate, and the cooling component comprises a mounting stage on which the substrate and the annular member are mounted.

With the arrangement of the first aspect of the present invention, since the consumable component is the annular member disposed in such a manner as to enclose the outer peripheral edge of the substrate, and the cooling component is the mounting stage on which the substrate and the annular member are mounted, the annular member can be kept at a temperature of 225° C. or less during etching of the substrate. As a result, the required level of the over-surface etching uniformity of the substrate mounted on the mounting stage can be met, and the life of the annular member can be increased.

The second aspect of the present invention provides a substrate processing apparatus comprising a processing chamber in which plasma processing is performed on a substrate under a reduced pressure, and a heat-transfer structure disposed in the processing chamber, wherein the heat-transfer structure comprises a consumable component comprising an exposed surface exposed to plasma, a cooling component that cools the consumable component, and a heat-transfer member interposed between the consumable component and the cooling component and made of a gel-like material, and a ratio of hardness of the heat-transfer member expressed in Asker C to thermal conductivity of the heat-transfer member expressed in W/m·K is less than 20.

The above and other objects, features, and advantages of the invention will become more apparent from the following detained description taken in conjunction with the accompanying drawings.

DETAILED DESCRIPTION OF THE PREFERRED EMBODIMENTS

The present invention will now be described in detail with reference to the drawings showing a preferred embodiment thereof.

First, a description will be given of a substrate processing apparatus provided with a heat-transfer structure according to an embodiment of the present invention.

Figure 1:
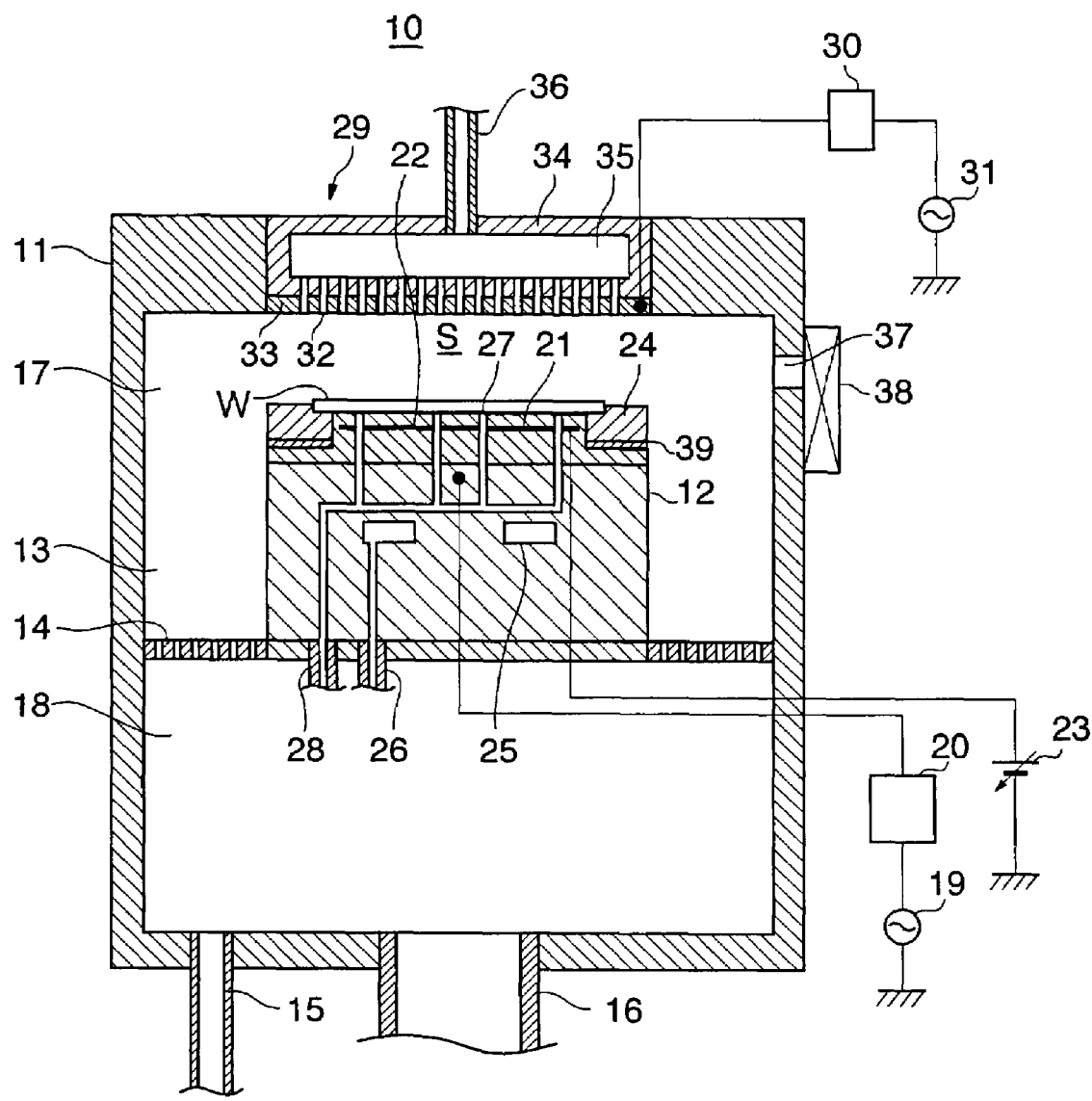
FIG. 1 is a sectional view schematically showing the construction of a substrate processing apparatus provided with a heat-transfer structure according to an embodiment of the present invention.

FIG. 1 is a sectional view schematically showing the construction of the substrate processing apparatus provided with the heat-transfer structure according to the present embodiment. This substrate processing apparatus is configured to perform etching on a polysilicon layer formed on a semiconductor wafer employed as a substrate.

As shown in FIG. 1, the substrate processing apparatus 10 is comprised of a chamber 11 (processing chamber) that houses a semiconductor wafer (hereinafter merely referred to as "the wafer") W with a diameter of 300 mm. A cylindrical susceptor 12 (cooling component) which is a mounting stage on which the wafer W is to be mounted is disposed in the chamber 11. In the substrate processing apparatus 10, a lateral exhaust path 13 which functions as a fluid path for discharging gas above the susceptor 12 from the chamber 11 is formed by inner walls of the chamber 11 and the periphery of the susceptor 12. An exhaust plate 14 is disposed in the lateral exhaust path 13. The inner walls of the chamber 11 are covered with quartz or yttria ($Y_2O_3$).

The exhaust plate 14 is a plate-like member having a number of holes and functions as a partition plate which partitions the chamber 11 into an upper part and a lower part. In the upper part (hereinafter referred to as "the reaction chamber") 17 formed by partitioning with the exhaust plate 14, plasma is generated as will be described later. In the lower part (hereinafter referred to as "the exhaust chamber (manifold)" 18 of the chamber 11, a roughing exhaust pipe 15 and a main exhaust pipe 16 which discharge gas from the chamber 11 are opened. A DP (dry pump), not shown, is connected to the roughing exhaust pipe 15, and a TMP (turbo molecular pump), not shown, is connected to the main exhaust pipe 16. The exhaust plate 14 captures or reflects ions and radicals generated in a processing space S, described later, of the reaction chamber 17 to prevent the leakage of ions and radicals therefrom into the manifold 18.

The roughing exhaust pipe 15 and the main exhaust pipe 16 discharge gas in the reaction chamber 17 from the chamber 11 through the manifold 18. Specifically, the roughing exhaust pipe 15 reduces pressure in the chamber 11 from atmospheric pressure to low vacuum, and the main exhaust pipe 15 cooperates with the roughing exhaust pipe 15 to reduce pressure in the chamber 11 to high vacuum (for example, 133 Pa (1 Torr) or less) so that pressure in the chamber 11 can be lower than in low vacuum.

A lower radio-frequency power supply 19 is connected to the susceptor 12 via a lower matcher 20, for applying a predetermined radio-frequency power to the susceptor 12. Thus, the susceptor 12 functions as a lower electrode. The lower matcher 20 reduces the amount of radio-frequency power reflected on the susceptor 12 so that radio-frequency power can be supplied to the susceptor 12 with the maximum efficiency.

An electrostatic chuck 22 having an electrostatic electrode plate 21 therein is disposed on top of the susceptor 12. The electrostatic chuck 22 is formed by overlaying an upper disk-shaped member with a given diameter on a lower disk-shaped member having a larger diameter than the diameter of the upper disk-shaped member. It should be noted that the electrostatic chuck 22 is made of aluminum, and for example, ceramic is sprayed on the upper surface of the upper disk-shaped member to thereby form a ceramic layer covering the upper surface. When the wafer W is mounted on the susceptor 12, the wafer W is positioned on the upper disk-shaped member of the electrostatic chuck 22.

Also, a direct-current power supply 23 is electrically connected to the electrostatic electrode plate 21 of the electrostatic chuck 22. When a positive high direct-current voltage is applied to the electrostatic electrode plate 21, a negative electrical potential develops on the surface of the wafer W which faces the electrostatic chuck 22 (hereinafter referred to as "the back side of the wafer W"). As a result, a potential difference develops between the electrostatic electrode plate 21 and the back side of the wafer W, so that Coulomb's force or Johnsen-Rahbeck's force generated due to the potential difference adsorbs and holds the wafer W on the upper disk-shaped member of the electrostatic chuck 22.

Also, an annular focus ring 24 (consumable component, annular member) is disposed in a part of the upper surface of the lower disk-shaped member on which the upper disk-shaped member is not overlaid (hereinafter referred to as "the focus ring placement surface"). The focus ring 24, which is made of a conductive member such as silicon, covers the periphery of the wafer W adsorbed on the upper disk-shaped member of the electrostatic chuck 22. Also, the focus ring 24 has an exposed surface exposed to the processing space S and causes plasma in the processing space S to converge toward the surface of the wafer W, so that etching efficiency can be improved.

Also, a ring-shaped coolant chamber 25 extending in the circumferential direction is provided in the susceptor 12. A low-temperature coolant such as cooling water or Galden (registered trademark) is supplied from a chiller unit, not shown, to the coolant chamber 25 in a circulating manner via a coolant pipe 26. The susceptor 12 cooled by the low-temperature coolant cools the wafer W and the focus ring 24 via the electrostatic chuck 22. Thus, in the present embodiment, the susceptor 12 functions as a direct cooling component, and the electrostatic chuck 22 functions as an indirect cooling component. The temperatures of the wafer W and the focus ring 24 are controlled according to mainly the temperature and flow rate of the coolant supplied to the coolant chamber 25 in a circulating manner.

A plurality of heat transfer gas supply holes 27 are bored in a part of the upper disk-shaped member of the electrostatic chuck 22 on which the wafer W is adsorbed and held (hereinafter referred to as "the adsorbing surface"). These heat-transfer gas supply holes 27 are connected to a heat-transfer gas supply unit, not shown, via a heat-transfer gas supply line 28, and the heat-transfer gas supply unit supplies helium (He) gas as heat-transfer gas to gaps between the adsorbing surface and the back side of the wafer W. The helium gas supplied to the gaps between the adsorbing surface and the back side of the wafer W transfers heat from the wafer W to the electrostatic chuck 22 in an effective manner.

In a ceiling part of the chamber 11, a gas introduction shower head 29 is disposed in opposed relation to the susceptor 12. An upper radio-frequency power supply 31 is connected to the gas introduction shower head 29 via an upper matcher 30 and applies a predetermined radio-frequency power to the gas introduction shower head 29. Thus, the gas introduction shower head 29 functions as an upper electrode. It should be noted that the upper matcher 30 is identical in function with the lower matcher 20 described above.

The gas introduction shower head 29 is comprised of a ceiling electrode plate 33 having a number of gas holes 32, and an electrode supporting member 34 which detachably supports the ceiling electrode plate 33. A buffer chamber 35 is provided inside the electrode supporting member 34, and a process gas introduction pipe 36 is connected to the buffer chamber 35. The gas introduction shower head 29 supplies the reaction chamber 17 with process gas supplied from the process gas introduction pipe 36 to the buffer chamber 35, such as mixed gas obtained by adding $O_2$ gas and inert gas such as Ar to bromine-based gas or chlorine-based gas.

Also, a carrying in/out port 37 for use in carrying the wafer W into or out of the reaction chamber 17 is provided in a side wall of the chamber 11, and a gate valve 38 which opens and closes the carrying in/out port 37 is mounted on the carrying in/out port 37.

In the reaction chamber 17 of the substrate processing apparatus 10, radio-frequency power is applied respectively to the susceptor 12 and the gas introduction shower head 29 so that radio-frequency power is applied to the processing space S between the susceptor 12 and the gas introduction shower head 29. As a result, in the processing space S, process gas supplied from the gas introduction shower head 29 is turned into high-density plasma to generate ions and/or radicals, and etching is performed on the wafer W using the ions and/or the radicals.

It should be noted that a CPU in a controller, not shown, provided in the substrate processing apparatus 10 controls the operation of the components of the substrate processing apparatus 10 described above in accordance with a program for the etching process.

Although in the substrate processing apparatus 10 described above, heat-transfer gas is supplied between the wafer W and the electrostatic chuck 22 so as to effectively transfer heat from the wafer W to the electrostatic chuck 22, no heat-transfer gas is supplied between the focus ring 24 and the electrostatic chuck 22. Also, since the focus ring 24 and the electrostatic chuck 22 are solid objects, if the focus ring 24 and the electrostatic chuck 22 are in direct contact with each other, minute gaps develop in a boundary between the focus ring 24 and the electrostatic chuck 22. Here, since pressure in the chamber 11 in which the susceptor 12 and the focus ring 24 are disposed, more specifically, pressure in the reaction chamber 17 is reduced to high vacuum as described above, the minute gaps in the boundary form a vacuum heat insulating layer.

During etching, the wafer W and the focus ring 24 exposed to plasma are increased in temperature due to heat transfer from the plasma, but the wafer W is cooled by the susceptor 12 via the electrostatic chuck 22 and thus kept at a temperature of about 100° C. On the other hand, once the vacuum heat insulating layer has been formed, the focus ring 24 is not cooled by the susceptor 12 via the electrostatic chuck 22 and thus increased in temperature to about 450° C. That is, a difference in temperature between the focus ring 24 and the wafer W increases, and on this occasion, the over-surface etching uniformity of the wafer W deteriorates, and the focus ring 24 wears out quickly. Also, since heat accumulates in the focus ring 24 over time, processing performance in the same lot deteriorates.

To solve these problems, the inventors of the present invention and others have proposed to keep the wafer W at a temperature of 225° C. or lower and control differences (variations) in the maximum temperature of the focus ring 24 to ±30° C. during etching of wafers in the same lot.

In view of the foregoing, in the present embodiment, the development of minute gaps in the boundary between the focus ring 24 and the electrostatic chuck 22 is prevented so as to improve heat transference between the focus ring 24 and the electrostatic chuck 22. Specifically, a heat-transfer sheet 39 (heat-transfer member) made of a gel-like material is interposed between the focus ring 24 and the electrostatic chuck 22. Since the heat-transfer sheet 39 made of the gel-like material is fluid, the minute gaps are filled fully to increase the degree of adhesion between the focus ring 24 and the electrostatic chuck 22, whereby heat transference between the focus ring 24 and the electrostatic chuck 22 can be improved. Here, since heat of the focus ring 24 is conducted to the susceptor 12 via the heat-transfer sheet 39 and the electrostatic chuck 22, the focus ring 24, heat-transfer sheet 39, electrostatic chuck 22, and susceptor 12 constitute a heat-transfer structure.

It can be considered that the heat transference of the heat-transfer sheet 39 becomes better as the thermal conductivity of the heat-transfer sheet 39 itself increases and the heat-transfer sheet 39 becomes softer, that is, the hardness of the heat-transfer sheet 39 decreases. For this reason, in the present embodiment, the ratio of hardness of the heat-transfer sheet 39 expressed in Asker C to the thermal conductivity of the heat-transfer sheet 39 expressed in W/m·K is set at less than 20 based on the results of experiments conducted by the inventors of the present invention, described later. As the heat-transfer sheet 39, a heat-transfer gel sheet "λ GEL" (registered trademark) (manufactured by GELTECH Co., Ltd.) is used.

Since the heat-transfer sheet 39 is an insulating member and the focus ring 24 and the electrostatic chuck 22 are conductive members, the focus ring 24, heat-transfer sheet 39, and electrostatic chuck 22 constitute a capacitor. If the amount of electric charge of the capacitor is large, this would affect the over-surface etching uniformity of the wafer W. For this reason, the capacity of the capacitor is required to be small. Accordingly, it is preferred that the heat-transfer sheet 39 is thin, and more specifically, the maximum thickness of the heat-transfer sheet 39 is set at 0.7 mm.

Also, since the heat-transfer sheet 39 is adhesive, the heat-transfer sheet 39 gets ripped and partially remains in an adhering state on the focus ring 24 and the electrostatic chuck 22 when the heat-transfer sheet 39 is peeled off from the focus ring 24 and the electrostatic chuck 22 during replacement of the focus ring 24. The part of the heat-transfer sheet 39 remaining in an adhering state on the electrostatic chuck 22 has to be completely removed, and this might cause deterioration of workability in replacement of the focus ring 24. Accordingly, in order to prevent the heat-transfer sheet 39 from getting ripped, it is preferred that the thickness of the heat-transfer sheet 39 is set at a certain value or less, and for example, the minimum thickness of the heat-transfer sheet 39 is set at 0.3 mm.

In the heat-transfer structure according to the present embodiment, the heat-transfer sheet 39 made of a gel-like material is interposed between the focus ring 24 and the susceptor 12, and more specifically, between the focus ring 24 and the electrostatic chuck 22, and the ratio of hardness of the heat-transfer sheet 39 expressed in Asker C to thermal conductivity of the heat-transfer sheet 39 expressed in W/m·K is set at less than 20. Since the heat-transfer sheet 39 fills fully minute gaps in the boundary between the focus ring 24 and the electrostatic chuck 22, the thermal conductivity between the focus ring 24 and the susceptor 12 is improved as compared with the conventional art, so that the susceptor 12 can cool the focus ring 24 with efficiency. As a result, the focus ring 24 can be kept at a temperature of 225° C. or lower during etching, whereby deterioration in the over-surface etching uniformity of the wafer W and the quick wearing of the focus ring 24 can be prevented. Further, heat accumulation in the focus ring 24 over time can be prevented, which prevents deterioration of process performance of wafers in the same lot.

Also, the focus ring placement surface of the electrostatic chuck 22 is polished in such a manner that the surface roughness of the focus ring placement surface is 1.6 or less in Ra. However, if the surface roughness of the focus ring placement surface is large, and as a result, a number of minute gaps develop between the focus ring 24 and the electrostatic chuck 22, the heat-transfer sheet 39 can fill these minute gaps to a sufficient degree. For this reason, the focus ring placement surface should not necessarily be polished, and the surface roughness of the focus ring placement surface may be 6.3 or greater in Ra. In this case, the manufacturing cost of the electrostatic chuck 22 can be reduced by omitting the polishing process. Also, by increasing the surface roughness of the focus ring placement surface, the actual contact area between the heat-transfer sheet 39 and the electrostatic chuck 22 can be increased, which improves the heat transference between the focus ring 24 and the electrostatic chuck 22.

Although in the present embodiment, the heat-transfer sheet 39 is interposed between the electrostatic chuck 22 and the focus ring 24, the heat-transfer sheet 39 is not necessarily required to be disposed at this location, but the heat-transfer sheet 39 has only to be disposed between a component to be heated and a member that lets heat escape from the component, which are arranged in the chamber 11.

Next, a description will be given of examples of the present invention.

First, the inventors of the present invention prepared a plurality of heat-transfer sheet 39 whose hardness expressed in Asker C is any of 10 to 100 and thermal conductivity expressed in W/m·K is any of 0.2 to 17. Then, each of the heat-transfer sheets 39 was interposed between the electrostatic chuck 22 and the focus ring 24 in the substrate processing apparatus 10, the wafer W was mounted on the upper disk-shaped member of the electrostatic chuck 22, and the wafer W was adsorbed and held on the upper disk-shaped member. Then, pressure in the chamber 11 was reduced to high vacuum, helium gas was supplied to gaps between the adsorption surface and the back side of the wafer W, and radio-frequency power was applied to the susceptor 12 and the gas introduction shower head 29 in three cycles of three minutes. Then, the saturation value of the temperature (hereinafter referred to as "the saturation temperature") of the focus ring 24 was measured.

Thereafter, the inventors arranged measured saturation temperature, thermal conductivity, and hardness of the focus ring 24 in Table 1 below.

TABLE 1

| Thermal conductivity W/m · K | Hardness in terms of Asker C | Saturation temperature ° C. |
| --- | --- | --- |
| 0.2 | 10.0 | 303.0 |
| 0.8 | 20.0 | 453.1 |
| 1.1 | 15.0 | 181.7 |
| 1.1 | 20.0 | 162.6 |
| 1.2 | 18.0 | 144.7 |
| 1.6 | 29.0 | 173.2 |
| 2.0 | 10.0 | 130.9 |
| 2.0 | 55.0 | 388.0 |
| 2.1 | 10.0 | 104.5 |
| 2.3 | 26.0 | 122.4 |
| 2.5 | 27.0 | 91.7 |
| 3.0 | 12.0 | 81.1 |
| 3.0 | 40.0 | 102.0 |
| 3.0 | 75.0 | 106.5 |
| 5.0 | 100.0 | 453.0 |
| 6.0 | 65.0 | 89.1 |
| 6.0 | 95.0 | 157.3 |
| 15.0 | 20.0 | 62.2 |
| 17.0 | 20.0 | 55.8 |

Figure 2:
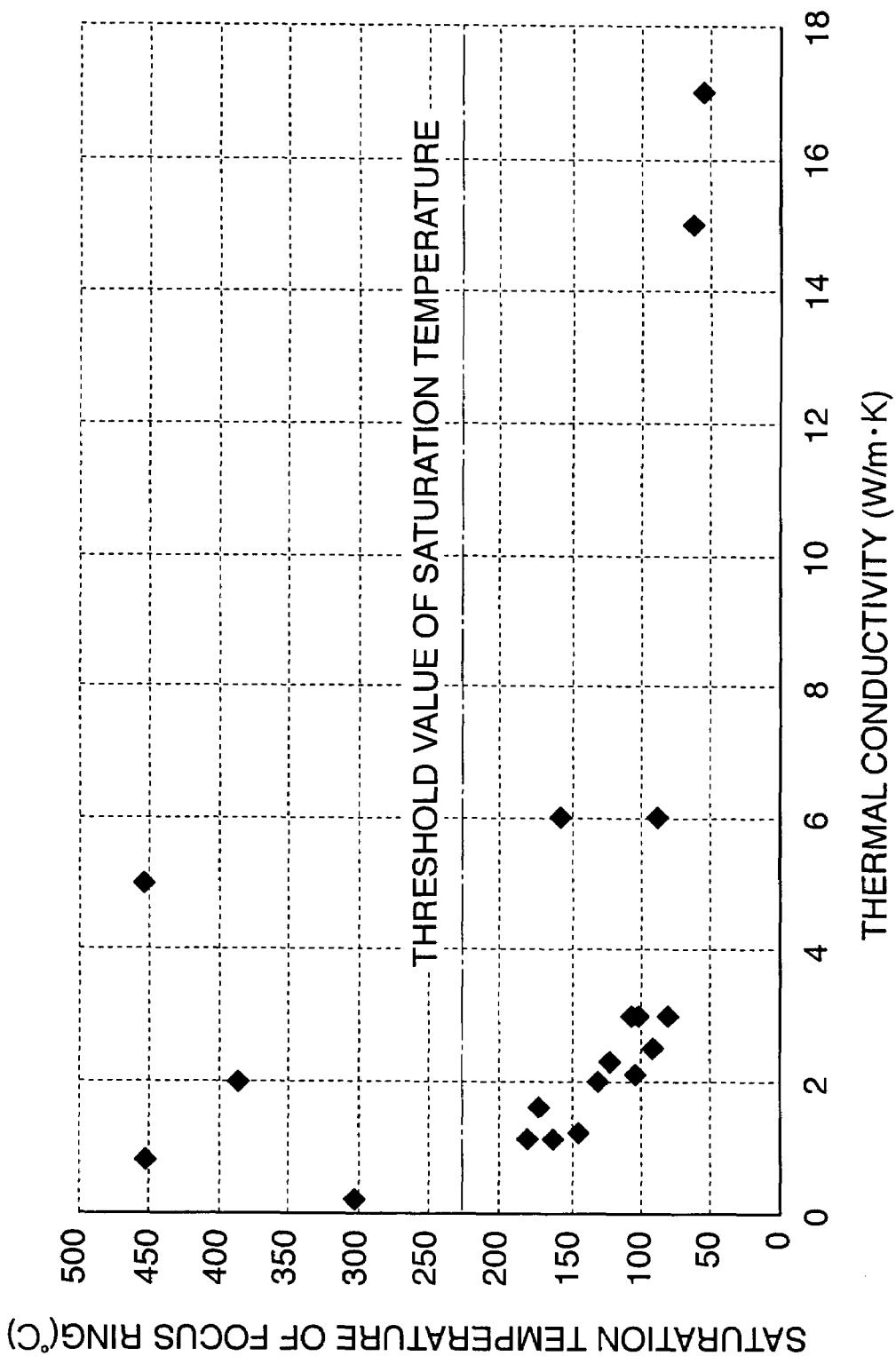
FIG. 2 is a graph showing the relationship between the thermal conductivity of a heat-transfer sheet and the saturation temperature of a focus ring appearing in FIG. 1.

First, the inventors arranged the relationship between thermal conductivity and saturation temperature in a graph shown in FIG. 2.

According to the graph of FIG. 2, as a whole, the saturation temperature of the focus ring 24 decreases as the thermal conductivity increases, but there may be exceptionally cases where the saturation temperature is 453.1° C. when the thermal conductivity is 0.8, the saturation temperature is 388° C. when the thermal conductivity is 2.0, the saturation temperature is 453° C. when the thermal conductivity is 5.0. Thus, it was impossible to obtain clear standards of thermal conductivity for keeping the temperature of the focus 24 at a threshold value of saturation temperature (225° C.) or less.

Figure 3:
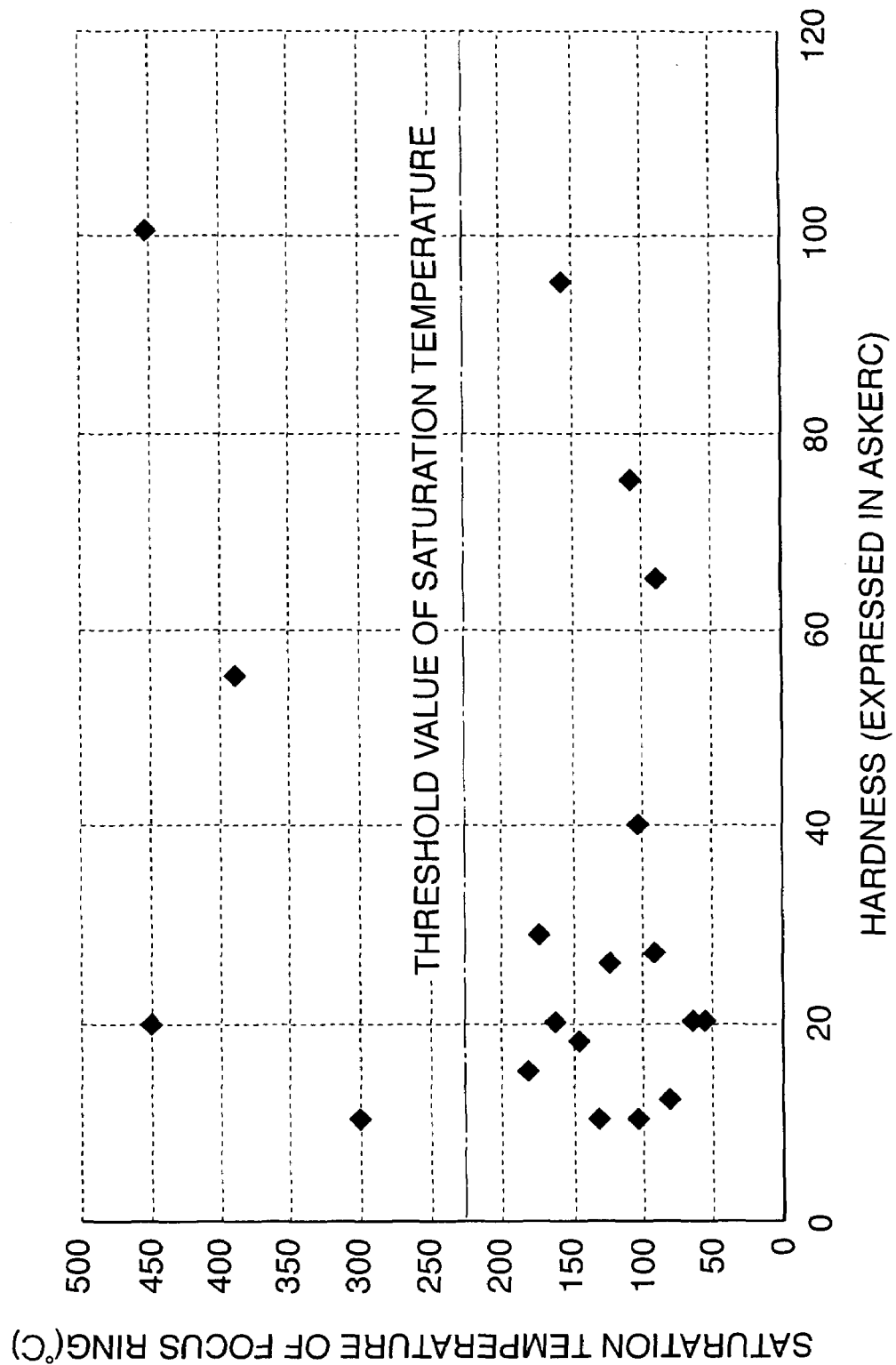
FIG. 3 is a graph showing the relationship between the hardness of the heat-transfer sheet and the saturation temperature of the focus ring appearing in FIG. 1.

Then, the inventors arranged the relationship between hardness and saturation temperature in a graph shown in FIG. 3.

According to the graph of FIG. 3, there may be exceptionally cases where the saturation temperature is 453.1° C. when the hardness is 20, the saturation temperature is 388° C. the hardness is 55, the saturation temperature is 453° C. when the hardness is 100. Thus, it was impossible to obtain clear standard of hardness for keeping the temperature of the focus 24 at the threshold value of saturation temperature or less.

The inventors studied the cases where the temperature of the focus ring 24 could not be kept at the threshold value of saturation temperature or less and found that in all the cases, the thermal conductivity was high and the hardness was high as well, or the hardness was low and the thermal conductivity was low as well. For this reason, the inventors focused attention on the ratio of hardness to thermal conductivity and found the relationship betweens saturation temperature and the ratio of hardness to thermal conductivity as shown in Table 2 below. The inventors arranged the relationship between saturation temperature and the ratio of hardness to thermal conductivity in a graph shown in FIG. 4.

TABLE 2

| Hardness/thermal conductivity | Saturation temperature ° C. |
|---|---|
| 50.0 | 303 |
| 25.0 | 453.1 |
| 13.6 | 181.7 |
| 18.2 | 162.6 |
| 15.0 | 144.7 |
| 18.1 | 173.2 |
| 5.0 | 130.9 |
| 27.5 | 388 |
| 4.8 | 104.5 |
| 11.3 | 122.4 |
| 10.8 | 91.7 |
| 4.0 | 81.1 |
| 13.3 | 102 |
| 25.0 | 106.5 |
| 20.0 | 453 |
| 10.8 | 89.1 |
| 15.8 | 157.3 |
| 1.3 | 62.2 |
| 1.2 | 55.8 |

Figure 4:
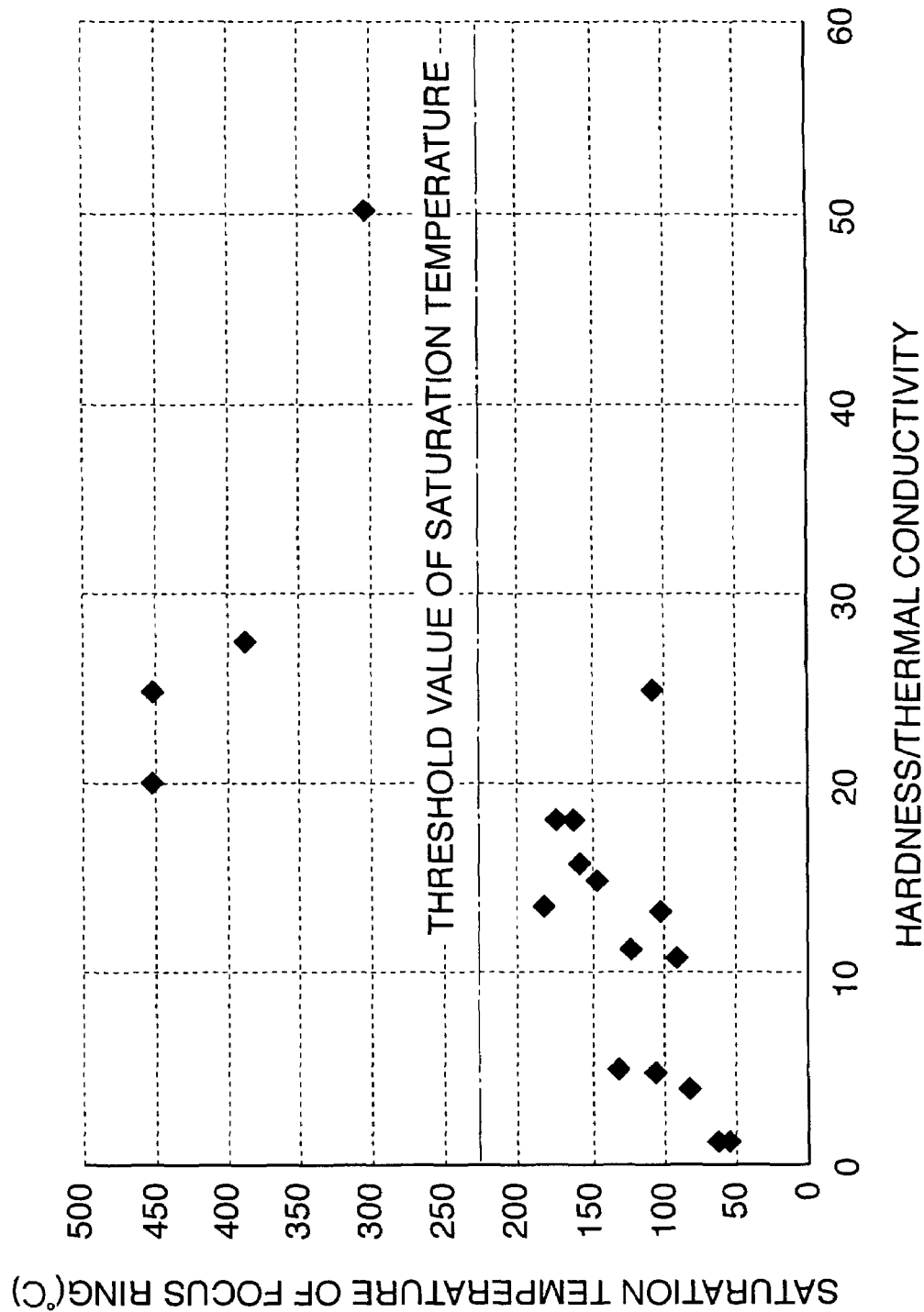
FIG. 4 is a graph showing the relationship between the ratio of the hardness to the thermal conductivity of the heat-transfer sheet and the saturation temperature of the focus ring appearing in FIG. 1.
Figure 5:
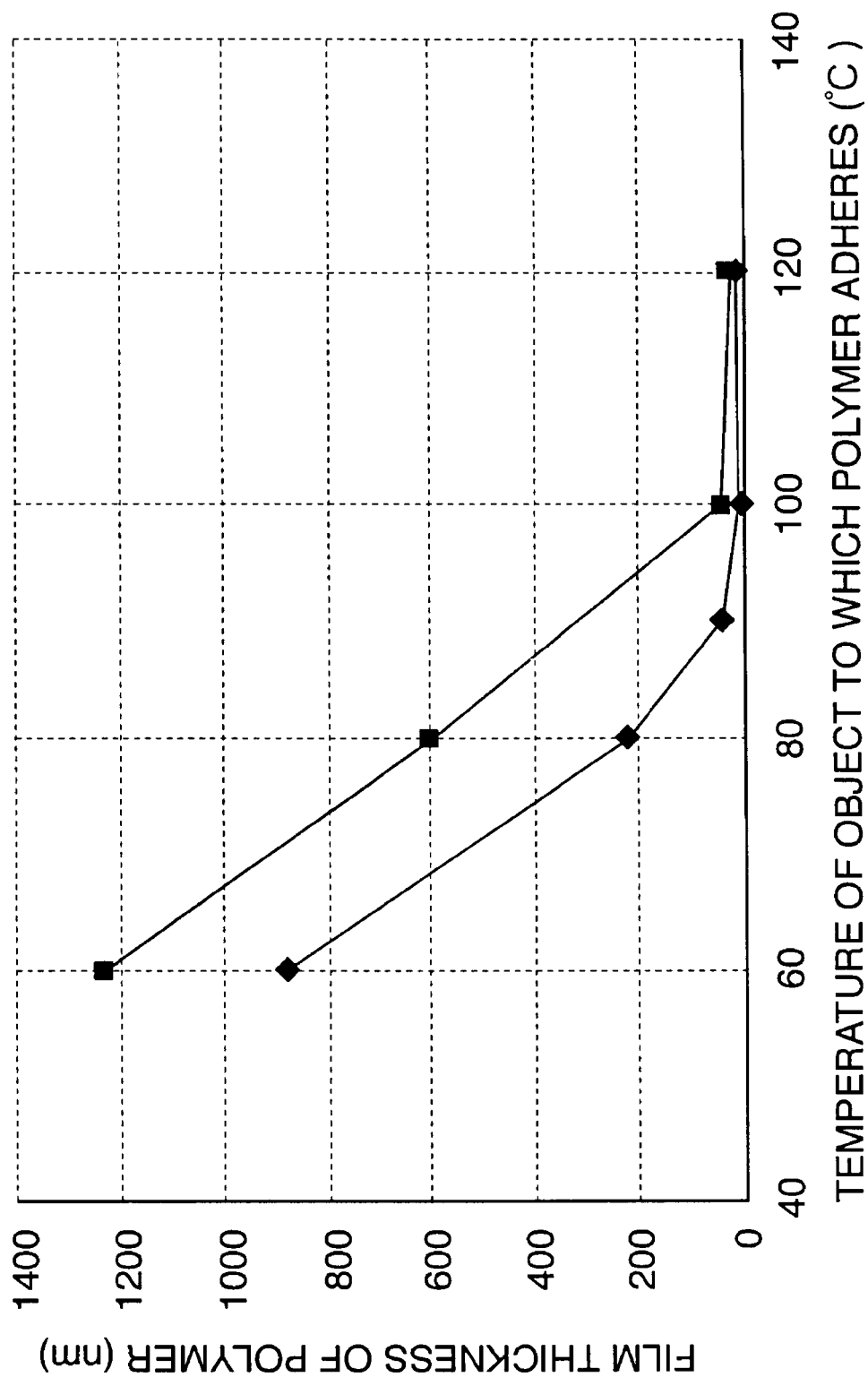
FIG. 5 is a graph showing the relationship between the film thickness of adhering polymer and the temperature of an object to which the polymer adheres.

According to the graph of FIG. 4, when the ratio of hardness to thermal conductivity is less than 20, the temperature of the focus ring 24 can be kept at the threshold value of saturation temperature or less.

Also, by using the heat-transfer sheet 39 whose ratio of hardness to thermal conductivity was less than 20, the inventors applied radio-frequency power to the susceptor 12 and the gas introduction shower head 29 in three cycles of three minutes, measured the saturation temperature of the focus ring 24 in each of the three cycles, and found that differences in saturation temperature were within the range of ±30° C.

That is, the inventors found that when the ratio of hardness of the heat-transfer sheet 39 expressed in Asker C to thermal conductivity of the heat-transfer sheet 39 expressed in W/m·K was less than 20, the temperature of the focus ring 24 can be kept at the threshold value of saturation temperature or less, and differences in saturation temperature in the radio-frequency power application cycles can be kept within the range of ±30° C.

What is claimed is:
1. A heat-transfer structure disposed in a processing chamber in which plasma processing is performed on a substrate under a reduced pressure, the structure comprising: an electrostatic chuck
 a consumable component including an exposed surface exposed to plasma; said consumable component includes an annular focus ring disposed to enclose an outer peripheral edge of the substrate;
 a cooling component that cools said consumable component; and
 a heat-transfer member interposed between said focus ring and said electrostatic chuck and made of a gel-like material,
 wherein a ratio of a hardness of said heat-transfer member expressed in Asker C to a thermal conductivity of said heat-transfer member expressed in W/m·K is less than 20,
 wherein a hardness of said heat-transfer member expressed in Asker C is 10 to 100, and
 wherein a surface roughness of a contact surface of said focus ring is 6.3 µm or greater in Ra, the contact surface contacting said heat-transfer member.

2. The heat-transfer structure according to claim 1, wherein said cooling component includes a mounting stage on which the substrate and said focus ring are mounted,
 said heat-transfer member is disposed outside the outer peripheral edge of the substrate, and
 a thickness of said heat-transfer member is 0.3 mm to 0.7 mm.

3. A substrate processing apparatus, comprising:
 a processing chamber in which plasma processing is performed on a substrate under a reduced pressure, an electrostatic chuck and
 a heat-transfer structure disposed in the processing chamber, wherein
 said heat-transfer structure includes a consumable component including an exposed surface exposed to plasma, said consumable component includes an annular focus ring disposed to enclose an outer peripheral edge of the substrate, a cooling component that cools the consumable component, and a heat-transfer member interposed between the focus ring and the electrostatic chuck and made of a gel-like material, and
 a ratio of a hardness of the heat-transfer member expressed in Asker C to a thermal conductivity of the heat-transfer member expressed in W/m·K is less than 20,
 wherein a hardness of the heat-transfer member expressed in Asker C is 10 to 100, and
 wherein a surface roughness of a contact surface of said focus ring is 6.3 µm or greater in Ra, the contact surface contacting said heat-transfer member.

4. The substrate processing apparatus according to claim 3, wherein
 the cooling component includes a mounting stage on which the substrate and the focus ring are mounted,
 the heat-transfer member is disposed outside the outer peripheral edge of the substrate, and
 a thickness of the heat-transfer member is 0.3 mm to 0.7 mm.

5. The heat-transfer structure according to claim 1, wherein the contact surface has not been polished.

6. The substrate processing apparatus according to claim 3, wherein the contact surface has not been polished.

7. The heat-transfer structure according to claim 1, wherein the thermal conductivity of said heat-transfer member expressed in W/m·K is 0.2 to 17.

8. The substrate processing apparatus according to claim 3, wherein the thermal conductivity of said heat-transfer member expressed in W/m·K is 0.2 to 17.

9. The heat-transfer structure according to claim 1, wherein the ratio is less than 20 such that a temperature of said consumable component is kept at less than a saturation temperature of 225° C. during the plasma processing.

10. The substrate processing apparatus according to claim 3, wherein the ratio is less than 20 such that a temperature of said consumable component is kept at less than a saturation temperature of 225° C. during the plasma processing.

* * * * *